US012753511B2

(12) United States Patent
Yin et al.

(10) Patent No.: US 12,753,511 B2
(45) Date of Patent: Oct. 6, 2026

(54) CHEMICAL VAPOR DEPOSITION EQUIPMENT AND METHOD THEREFOR

(71) Applicant: ADVANCED MICRO-FABRICATION EQUIPMENT INC. CHINA, Shanghai (CN)

(72) Inventors: Gerald Zheyao Yin, Shanghai (CN); Hailong Zhang, Shanghai (CN); Yunling Pang, Shanghai (CN); Hai Cong, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 174 days.

(21) Appl. No.: 18/713,616

(22) PCT Filed: Sep. 19, 2022

(86) PCT No.: PCT/CN2022/119603
§ 371 (c)(1),
(2) Date: May 24, 2024

(87) PCT Pub. No.: WO2023/124270
PCT Pub. Date: Jul. 6, 2023

(65) Prior Publication Data

US 2025/0027203 A1 Jan. 23, 2025

(30) Foreign Application Priority Data

Dec. 31, 2021 (CN) ........................ 202111666778.2

(51) Int. Cl.
*C23C 16/52* (2006.01)
*C23C 16/455* (2006.01)

(52) U.S. Cl.
CPC ........ *C23C 16/52* (2013.01); *C23C 16/45587* (2013.01)

(58) Field of Classification Search
CPC ................................ C03B 25/10; C23C 16/52
(Continued)

(56) References Cited

U.S. PATENT DOCUMENTS 4,496,609 A * 1/1985 McNeilly ................ F27B 17/02 117/88
4,547,404 A * 10/1985 Campbell ............. C23C 16/481 427/248.1

(Continued)

FOREIGN PATENT DOCUMENTS

CN 212102999 U 12/2020
JP 2881217 B2 * 4/1999

OTHER PUBLICATIONS

International Search Report from related PCT Patent Application No. PCT/CN2022/119603, mailed on Dec. 9, 2022, 4 pages.

*Primary Examiner* — Cachet I Proctor
(74) *Attorney, Agent, or Firm* — Womble Bond Dickinson (US) LLP

(57) ABSTRACT

The present application discloses a chemical vapor deposition equipment and method therefor, the equipment including: a reaction chamber; an outer housing provided outside the reaction chamber, an accommodation space being formed between the outer housing and the reaction chamber; a plurality of radiant heat sources provided in the accommodation space; and pressure adjusting device used for independently regulating the pressure in the reaction chamber and the accommodation space. Advantages thereof are as follows: the pressure of the accommodation space of the equipment is smaller than the atmospheric pressure, which helps to reduce the pressure on the wall of the reaction chamber while not affecting the heat transfer efficiency of (Continued)

the radiant heat sources, thereby contributing to the uniform heating of the reaction area in the reaction chamber, and improving the yield rate of substrate process production.

26 Claims, 5 Drawing Sheets

(58) Field of Classification Search
USPC ........................................................ 427/248.1
See application file for complete search history.

(56) References Cited

U.S. PATENT DOCUMENTS

| | | | | |
|---|---|---|---|---|
| 4,709,655 | A * | 12/1987 | Van Mastrigt | C23C 16/54 118/728 |
| 5,653,808 | A * | 8/1997 | MacLeish | C23C 16/4584 118/725 |
| 6,326,597 | B1 * | 12/2001 | Lubomirsky | H01L 21/67248 118/723 R |
| 2009/0277386 | A1 | 11/2009 | Takagi et al. | |
| 2010/0240224 | A1 * | 9/2010 | Wu | F27B 17/0025 219/390 |
| 2021/0324514 | A1 * | 10/2021 | Ye | C30B 25/14 |
| 2021/0388501 | A1 * | 12/2021 | Choi | C30B 25/10 |

* cited by examiner area

CHEMICAL VAPOR DEPOSITION EQUIPMENT AND METHOD THEREFOR

RELATED APPLICATIONS

The present application is the national phase of International Application No. PCT/CN2022/119603, filed on Sep. 19, 2022, which claims priority to and the benefit of Chinese Patent Application No. 202111666778.2, filed on Dec. 31, 2021, and the disclosures of which are hereby incorporated herein by reference in their entireties.

FIELD OF TECHNOLOGY

The present application relates the field of the semiconductor equipment, more specifically to a chemical vapor deposition equipment and method thereof.

BACKGROUND

At present, plasma etching, physical vapor deposition (PVD for short), chemical vapor deposition (CVD for short) and other processes are often used in the microfabrication processes of semiconductor devices or substrates, such as manufacturing flexible display screens, flat panel displays, light-emitting diodes, solar cells, etc. Microfabrication manufacturing includes a variety of different processes and steps, among which chemical vapor deposition process is widely used, the process can deposit a variety of materials, including a wide range of insulating materials, most metal materials and metal alloy materials, and this process is generally carried out in a high vacuum reaction chamber.

With the shrinking of the feature size of semiconductor device and the increasing integration of device, higher requirements are placed on the uniformity of chemical vapor deposited thin films. Although the performance of chemical vapor deposition equipment has been greatly improved after many upgrades, there are still many deficiencies in the uniformity of thin film deposition, especially with the increasing size of substrate, the existing vapor deposition methods and equipment have been difficult to meet the uniformity requirements of the thin films.

In the process of thin film deposition, various process conditions may affect the uniformity of thin film deposition on the surfaces of the substrates, such as the direction and distribution of reaction gas flow, the temperature field of the heated substrates, and the pressure distribution in the reaction chamber. If the process environment in the reaction area of the reaction chamber is not completely consistent, the thin film deposited on the surface of the substrate may have non-uniform thickness, non-uniform composition, non-uniform physical properties and other undesirable phenomena, thereby reducing the yield rate of the production of the substrates. Therefore, it is necessary to improve the existing chemical vapor deposition equipment to improve the uniformity of the thin film deposited on the substrates. In addition, for the epitaxial growth process of silicon or silicon germanium materials, since these epitaxial materials are usually the bottom layer of semiconductor device, the critical dimension (CD) is extremely small, usually only a few nanometers, moreover, the epitaxial materials cannot withstand high temperature for a long time, otherwise the high temperature may cause damage to the semiconductor device, so it is necessary to heat the substrate to a temperature sufficient for epitaxial growth of silicon materials in a very short time, such as 600-700 degrees. Due to harsh temperature rising requirements, the silicon epitaxial process usually heats the substrate in the reaction chamber by using high-power heating lamps through a transparent reaction chamber made of quartz. Since the pressure inside the reaction chamber is much lower than atmospheric pressure outside the quartz reaction chamber, in order to maintain the structure of the reaction chamber from deformation or fragmentation due to the huge pressure difference inside and outside the reaction chamber, it is necessary to design a pressure-resistant structure for the reaction chamber. For example, a plurality of reinforcing ribs are provided around the reaction chamber with flat plate shape upper and lower quartz chamber walls, or the upper and lower quartz chamber walls are designed to be dome-shaped to resist atmospheric pressure. The thickness of the outer walls made of quartz is usually 6-8 mm to allow as much radiation energy as possible to penetrate into the reaction chamber while still resisting atmospheric pressure. The above two structures have their own advantages and disadvantages, the flat plate chamber can ensure the stable distribution of gas flow when a gas flows through the entire chamber, but a large number of reinforcing ribs (more than 10) above may block the radiant light of heating, resulting in non-uniform temperature distribution; for the dome-shaped reaction chamber, the temperature distribution is more uniform, but the gas flow may generate a lot of chaotic turbulence when it flows into the dome-shaped reaction area, making it difficult to control the gas flow distribution.

SUMMARY

The object of present application is to provide a chemical vapor deposition equipment and method therefor, the equipment combines the reaction chamber, the outer housing and the pressure adjusting device together, so that during process, the pressure in the accommodation space between the reaction chamber and the outer housing is adjusted to be lower than the atmospheric pressure via the pressure adjusting device to reduce the pressure difference between the inside and outside of the reaction chamber and thus, reduce the pressure that the reaction chamber previously needs to sustain, thereby further eliminating the need to provide too many pressure-bearing ribs on the wall of the reaction chamber, ensuring the uniformity of heat transfer of radiant heat sources and heating uniformity of the reaction area in the reaction chamber, and further contributing to thin film deposition uniformity of the substrate and increasing the yield of substrate processing.

In order to achieve above object, the present application is realized through following technical solutions:

a chemical vapor deposition equipment, including:

- a reaction chamber, having a gas inlet and a gas outlet, a susceptor being provided in the reaction chamber for carrying a substrate;
- an outer housing, provided outside the reaction chamber, an accommodation space being formed between an inner wall of the outer housing and an outer wall of the reaction chamber;
- a plurality of radiant heat sources, provided in the accommodation space and used for heating the substrate through the outer wall of the reaction chamber; and
- pressure adjusting device(s), used for independently regulating the pressure of the reaction chamber and the accommodation space.

Optionally, the equipment further includes:

- gas driving devices, used for enhancing the gas flow in the accommodation space.

Optionally, the gas driving devices are provided in the accommodation space, driving the gas to flow around the outer wall of the reaction chamber and the inner wall of the outer housing in the accommodation space, the outer housing is further provided with a first heat exchange device.

Optionally, the reaction chamber includes a gas inlet area corresponding to the gas inlet, a gas outlet area corresponding to the gas outlet and a reaction area between the gas inlet area and the gas outlet area;

a plurality of reinforcing ribs are also provided on the outer wall of the reaction chamber, and density of the reinforcing ribs on the outer wall of the reaction area is smaller than that on the outer walls of the gas inlet area or the gas outlet area on both sides of the reaction area.

Optionally, the reaction chamber includes a gas inlet area corresponding to the gas inlet, a gas outlet area corresponding to the gas outlet and a reaction area between the gas inlet area and the gas outlet area, in which the outer wall of the reaction area is provided with one reaction area reinforcing rib, the downward projection of the reaction area reinforcing rib passes through the center of the substrate, the reinforcing ribs adjacent to the reaction area reinforcing rib are located on the outer wall of the reaction chamber corresponding to the gas inlet area or the gas outlet area.

Optionally, the reinforcing ribs and the reaction chamber all made of quartz.

Optionally, a bottom wall of the reaction chamber includes an extension tube extending downwards, a rotating shaft is provided in the extension tube, and a top of the rotating shaft is used to support and drive the susceptor, thereby the substrate rotating in the reaction chamber.

Optionally, the reaction chamber includes a dome-shaped top wall, a height from the edge of the substrate to the top wall is H1, and a height from the center of the substrate to the top wall is H2, H2<1.05*H1.

Optionally, the two ends of the reaction chamber include a first flange and a second flange, and the first flange and the second flange are closely attached to a first fastener and a second fastener on the outer housing respectively.

Optionally, the outer housing includes a top plate, a bottom plate and side walls, and the top plate, the bottom plate and the side walls together with the outer wall of the reaction chamber, the first fastener and the second fastener form the accommodation space.

Optionally, the outer housing is made of aluminum, and the first fastener and the second fastener are made of stainless steel.

Optionally, the outer housing, the first fastener and the second fastener are provided with cooling fluid channels, respectively.

Optionally, the equipment also includes:

a temperature control loop, which connects to the accommodation space and forms a closed loop together, the closed loop includes the gas driving device and a second heat exchange device, the gas driving devices drive the gas to flow in the closed loop, the second heat exchange device is used to cool the gas in the closed loop.

Optionally, the gas in the temperature control loop flows into the accommodation space from a top and/or a bottom of the accommodation space, and the gas in the accommodation space flows out of the accommodation space from both sides of the accommodation space.

Optionally, the gas is air, helium, nitrogen or a mixture of nitrogen and helium.

Optionally, the equipment also includes:

a secondary temperature control loop, which is connected to the temperature control loop, the secondary temperature control loop including a first container in which the internal pressure is higher than that in the accommodation space, and a second container in which the internal pressure is lower than that in the accommodation space.

Optionally, an outlet end of the outer housing includes an outer housing end plate, a gap is formed between the outer housing end plate and the first fastener, at least one pressure device is provided inside the gap or outside the outer housing for providing compressive force to the first fastener.

Optionally, a deposition method using the chemical vapor deposition equipment, including following steps:

loading the substrate on the susceptor in the reaction chamber;

regulating the pressure in the accommodation space using the pressure adjusting device(s), thereby the pressure in the accommodation space lower than atmospheric pressure;

performing chemical vapor deposition process in the reaction chamber; and driving the gas flow in the accommodation space using the gas driving devices.

Optionally, the pressure in the accommodation space is set at 0.1-0.6 atmosphere pressure by the pressure adjusting device.

Optionally, a processing equipment for epitaxial growth, including:

a reaction chamber with a gas inlet and a gas outlet configured at both ends, in which a susceptor is provided therein for carrying substrate, the gas inlet and the gas outlet are used to form a reaction gas flow parallel to the susceptor; the reaction chamber includes a gas inlet area corresponding to the gas inlet, a gas outlet area corresponding to the gas outlet, and a reaction area between the gas inlet area and the gas outlet area;

an outer housing, provided outside the reaction chamber, an accommodation space being formed between an inner wall of the outer housing and an outer wall of the reaction chamber, and the accommodation space being connected to a first pressure adjusting device;

a plurality of radiant heat sources provided in the accommodation space outside the reaction chamber to heat the substrate.

Optionally, the reaction chamber also including a plurality of reinforcing ribs provided on the outer wall of the reaction chamber, and the density of the reinforcing ribs on the outer wall of the reaction area is smaller than that on the outer walls of the gas inlet area or the gas outlet area on both sides.

Optionally, a bottom wall of the reaction chamber includes an extension tube extending downwards, a rotating shaft is provided in the extension tube, and a top of the rotating shaft is used for supporting and driving the susceptor, thereby the susceptor rotating in the reaction chamber.

Optionally, the equipment further includes:

a temperature control loop, which is connected to the accommodation space to form a closed loop together, the closed loop including gas driving devices and a heat exchange device, the gas driving devices driving the gas to flow in the closed loop, and the heat exchange device being used to cool the gas in the closed loop.

Optionally, the equipment further includes:

a second pressure adjusting device, connected to the reaction chamber, in which the first pressure adjusting device and the second pressure adjusting device are independently controlled, the pressure in the accommodation space is lower than the atmospheric pressure and higher than the pressure in the reaction chamber when epitaxial growth is performed.

Optionally, the equipment further includes:

gas driving devices, which serve to enhance a gas flow in the accommodation space.

Optionally, a vacuum processing equipment, including:

a vacuum processing chamber, which has a gas inlet and a gas outlet, and a susceptor is provided in the vacuum processing chamber for carrying the substrate;

an outer housing, which is provided outside the vacuum processing chamber, an accommodation space is formed between an inner wall of the outer housing and an outer wall of vacuum processing chamber;

a plurality of radiant heat sources, which are provided in the accommodation space and used for heating the substrate through the outer wall of the vacuum processing chamber;

and the pressure adjusting device(s), used for independently regulating the pressure in the vacuum processing chamber and the accommodation space, in which two ends of the vacuum processing chamber include a first flange and a second flange, and the first flange and the second flange are closely attached to the first fastener and the second fastener on the outer housing, respectively; and an outlet end of the outer housing includes an outer housing end plate, a gap is formed between the outer housing end plate and the second fastener, at least one pressure device is provided inside the gap or outside the outer housing for providing compressive force to the second fastener.

Compared with the prior art, the present application has following advantages:

in the chemical vapor deposition equipment and method therefor of the present application, the equipment further combines the reaction chamber, the outer housing, the radiant heat sources and the pressure adjusting device together, so that during process, the pressure in the accommodation space between the reaction chamber and the outer housing is lower than atmospheric pressure by means of regulation of the pressure adjusting device, the equipment also ensures reaction area heating uniformity in the reaction chamber, and at the same time reduces the pressure on the wall of the reaction chamber while ensuring the normal progress of the thin film deposition process of the substrate in the reaction chamber, which helps to improve heat supply efficiency of the radiant heat sources and uniformity of gas flow in the reaction chamber, and ensures the quality of thin film deposition of the substrate.

Further, the equipment further includes a temperature control loop, which forms a closed loop with the accommodation space, thereby implementing the flow and heat exchange of the cooling gas in the closed loop through the second gas driving devices and the second heat exchange device, and thus improving the cooling efficiency of the reaction chamber.

Further, the equipment also includes a secondary temperature control loop, which includes a first container and a second container with pressure differences from the accommodation space so as to implement short-term rapid cooling of the reaction chamber to achieve expected process effect, also realize the control of thin film deposition process, and further ensure the quality of substrate etching.

DETAILED DESCRIPTION OF THE EMBODIMENTS

In order to make the objects, technical solutions and advantages of the embodiments of the present application more clear, the technical solutions in the embodiments of the present application may be clearly and completely described below in conjunction with the drawings in the embodiments of the present application, obviously, the described embodiments are parts of embodiments of the present application, but not all embodiments. Based on the embodiments of the present application, all other embodiments obtained by persons of ordinary skill in the art without creative efforts belong to the protection scope of the present application.

It should be noted that, in the application, the terms "include", "comprise", "have" or any other variant thereof are intended to cover a non-exclusive inclusion, therefore, a process, method, article or end-equipment including a set of elements includes not only those elements but also other elements not expressly listed or which are inherent in such a process, method, article or end-equipment.

It should be noted that, the drawings are all in very simplified form and use imprecise ratios, and are only used to facilitate and clearly illustrate embodiments of the present application.

Figure 1:
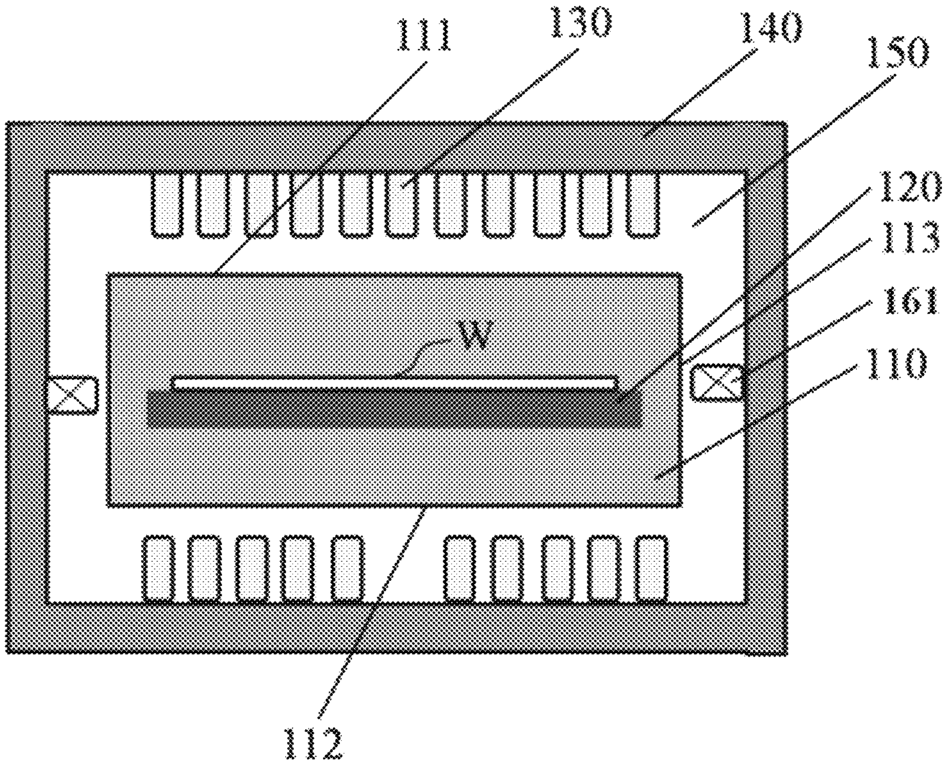
FIG. 1 is the simplified schematic view of the chemical vapor deposition equipment of the present application.
Figure 2:
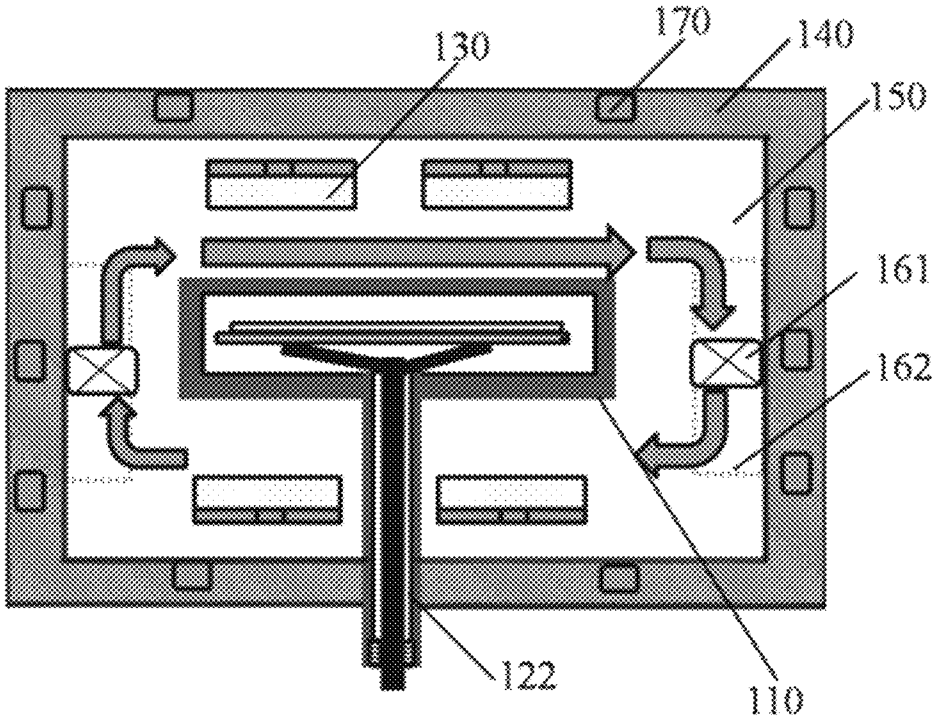
FIG. 2 is the schematic view of the gas flow in the chemical vapor deposition equipment of the present application.

As shown in FIG. 1 and FIG. 2 combined, it is a schematic view of a chemical vapor deposition equipment (CVD) of the present application, the equipment includes a reaction chamber 110, a processing space is formed inside the reaction chamber 110, and a susceptor 120 is provided in the processing space, and the susceptor 120 is used to carry one or more substrates W for chemical vapor deposition process, the chemical vapor deposition process includes depositing materials on the upper surface of the at least one substrate W. The chamber body of the reaction chamber 110 has an upper chamber wall 111 at the top end, a lower chamber wall 112 at the bottom end, and side chamber walls 113 extending on both sides between the upper chamber wall 111 and the lower chamber wall 112, optionally, the upper chamber wall 111 and the lower chamber wall 112 are made of optically transparent or translucent materials that can transmit thermal radiation (such as quartz materials that are transparent to specific infrared bands). Further referring to FIG. 4, one end of the reaction chamber 110 is provided with a gas inlet area corresponding to the gas inlet, the other end of the reaction chamber 110 is provided with a gas outlet area corresponding to the gas outlet, and a reaction area is located between the gas inlet area and the gas outlet area, the substrate W is located in the reaction area, and the reaction gas used for deposition flows into the reaction chamber 110 from the gas inlet, performs a chemical vapor deposition process in the reaction area, and flows out of the reaction chamber 110 through the gas outlet.

Further, the equipment also includes a plurality of radiant heat sources 130 that provide thermal energy to the reaction chamber 110 and the substrate W, each of the radiant heat sources 130 is provided outside the reaction chamber 110 to heat the reaction chamber 110 and the substrate W therein. Optionally, the radiant heat sources 130 are high-intensity tungsten lamps with transparent quartz housing containing halogen gas such as iodine, only a small part of the radiant heat energy generated by the high-intensity tungsten lamps is absorbed by the upper chamber wall 111 or the lower chamber wall 112 so that the heat energy generated by each of radiant heat sources 130 reaches the substrate W and the susceptor 120 in the reaction chamber 110 to the maximum extent. During the process, each of the radiant heat sources 130 heats the reaction chamber 110 of the chemical vapor deposition equipment and the at least one substrate W to the required process temperature, so that the reaction gas in the reaction chamber 110 is thermally decomposed to deposit thin film materials on the upper surface of the substrate W. Optionally, the deposited thin film materials are semiconductor materials such as silicon and germanium, and may also include other doped materials such as group III, group IV and/or group V materials.

Most chemical vapor deposition processes usually need to be carried out under high temperature and high vacuum conditions, and the reaction chamber 110 is usually heated to a relatively high temperature, moreover, the pressure in the reaction chamber 110 is much lower than atmospheric pressure, the pressure difference between the inside and outside of the reaction chamber 110 is relatively large, and the pressure borne by the chamber wall is also very large. If the pressure bearing capability of the reaction chamber 110 is enhanced by increasing the wall thickness of the reaction chamber 110, the wall of the reaction chamber 110 may be so thick that it absorbs too much thermal radiation, thereby reducing the impact of the radiant heat sources 130 on the substrate in the reaction chamber 110 and increasing the power required for the substrate to reach process temperature. On the other hand, if the mechanical strength of the reaction chamber 110 is increased by uniformly adding a plurality of pressure-bearing strips on the outside of the reaction chamber 110 to improve its pressure resistance capability, the pressure-bearing strips provided at intervals may block the heat energy transferred from the radiant heat source 130 to the reaction chamber 110, resulting in non-uniform heat distribution on the substrate W in the reaction chamber 110, further affecting the uniformity of the thin film deposition on the substrate W.

Based on the above problems, the chemical vapor deposition equipment of the present application further includes an outer housing 140. Specifically, the outer housing 140 is provided outside the reaction chamber 110, an accommodation space 150 is formed between the inner wall of the outer housing 140 and the outer wall of the reaction chamber 110, the accommodation space 150 and the reaction chamber 110 are connected with pressure adjusting device(s) which are used for adjusting the pressure of the accommodation space 150 and the reaction chamber 110 independently. The pressure adjusting device may be a vacuum pump, which is respectively connected to the reaction chamber 110 and the accommodation space 150 through two pipelines, and at least one pipeline is provided with a resistance adjusting device so that the pressures of the reaction chamber 110 and the accommodation space 150 do not interfere with each other. In some other embodiments, the pressure adjusting device may include two vacuum pumps, namely a first vacuum pump and a second vacuum pump, both of which are respectively connected to the reaction chamber 110 and the accommodation space 150, so that the pressures in the reaction chamber 110 and the accommodation space 150 can be independently adjusted to different values, for example, the pressure in the accommodation space 150 is lower than atmospheric pressure and higher than the pressure of the reaction chamber 110 when performing the chemical vapor deposition process. A plurality of radiant heat sources 130 are provided in the accommodation space 150.

It can be determined from the above that during process, the pressure of the accommodation space 150 between the outer housing 140 and the reaction chamber 110 is lower than the atmospheric pressure, and the reaction chamber 110 is in a high vacuum state, the absolute value of the pressure difference between the interior of the reaction chamber 110 and the accommodation space 150 is smaller than the absolute value of the pressure difference between the interior of the reaction chamber 110 and the atmospheric environment, the accommodation space 150 reduces the pressure that the walls of the reaction chamber 110 need to bear, so that there is no need to set too many pressure-bearing strips on the wall of the reaction chamber 110, which ensures the uniformity of heat transfer by the radiant heat sources 130, contributing to the uniformity of the thin film deposition on the substrate W.

In some embodiments, the chemical vapor deposition equipment further includes first gas driving devices 161 to enhance the gas flow in the accommodation space 150. The positions of the first gas driving devices 161 are not limited, as long as they can realize the control of the gas flow state in the accommodation space 150.

The first gas driving devices 161 accelerate the gas flow in the accommodation space 150, so that the gas undergoing free thermal movement in the accommodation space 150 is converted into an gas flow flowing in clusters, the temperature of the outer wall of the reaction chamber 110 is reduced within a certain range, so that the temperature of the outer wall of the reaction chamber 110 is lower than the defined temperature, thereby preventing the reaction gas from being deposited on the inner wall of the reaction chamber 110 to form contamination particles and falling down, reducing the possibility of contamination of the substrate W.

Optionally, the chemical vapor deposition equipment is a processing equipment for epitaxial growth, the gas inlet and the gas outlet of the reaction chamber 110 of the equipment are used to form a reaction gas flow parallel to the susceptor 120, so as to make the gas flow uniform above the substrate W, and further ensure the uniformity of epitaxial growth.

Embodiment 1

As shown in combination of FIGS. 1 to 4 the schematic views of a chemical vapor deposition equipment (CVD) in the embodiment, the device includes a reaction chamber 110 (see FIG. 4) with a rectangular gas flow space, the reaction chamber 110 may be used to process one or more substrates W. The reaction chamber 110 is provided with a gas inlet area corresponding to the gas inlet, a gas outlet area corresponding to the gas outlet, and a reaction area located between the gas inlet area and the gas outlet area. The process gas flows horizontally into the reaction chamber 110 (see FIG. 3*a*) from the gas inlet in the direction indicated by the arrow in the figure, and exhaust gas is discharged from the gas exhaust. The reaction chamber 110 has a flat cuboid structure, and the process gas flows horizontally in the reaction chamber 110, which ensures the uniformity of the gas flow in the reaction chamber 110, thereby ensuring the stability of the thin film deposition process. In the process, the pressure adjusting device independently regulates the pressure in the reaction chamber 110 and the accommodation space 150 so that the pressure in the accommodation space 150 is lower than atmospheric pressure, and the radiant heat sources 130 provides heat energy for the at least one substrate W.

As can be determined from the above, during the process, the accommodation space 150 between the outer housing 140 and the reaction chamber 110 in the chemical vapor deposition equipment is in a low-pressure state, the pressure difference between the accommodation space 150 and the reaction chamber 110 is smaller than the pressure difference between the reaction chamber 110 and the atmospheric environment. Under the condition that the thin film deposition process of the at least one substrate W in the reaction chamber 110 is proceeded normally, the accommodation space 150 decreases the pressure borne by the wall of the reaction chamber 110 to allow the reaction chamber 110 to maintain its pressure capacity without increasing its wall thickness or adding multiple pressure-bearing strips, the thermal energy transfer efficiency of the radiant heat sources 130 is thus ensured, the waste of thermal energy is thus avoided, and the uniformity of thermal energy transfer is also ensured. At the same time, each cross-section through which the reactant gas flows in the square-structured reaction chamber 110 is always rectangular, therefore, it is ensured that the reaction gas is in a horizontal flow state in the reaction chamber 110, and the uniformity of the gas flow in the reaction chamber 110 is ensured, the uniform heat energy provided by the radiant heat sources 130 is applied to the uniformly flowing reaction gas, which further ensures the uniformity of the thin film deposition on the at least one substrate W and improves the yield of substrate production.

Further, in the embodiment, the first gas driving devices 161 are provided in the accommodation space 150 to drive a gas to flow around the outer wall of the reaction chamber 110 and the inner wall of the outer housing in the accommodation space 150. The gas flowing in the accommodation space 150 takes away the heat from the outer wall of the reaction chamber 110, implementing cooling of the reaction chamber 110 and preventing pollutants from adhering to the inner wall of the reaction chamber 110. Optionally, the first gas driving devices 161 are fans, and the first gas driving devices 161 are respectively provided on both sides of the reaction chamber 110 to facilitate gas flow in the accommodation space 150.

In order to further improve temperature control of the accommodation space 150, the chemical vapor deposition equipment further includes a first heat exchange device 162, and the first heat exchange device 162 and the first gas driving devices 161 are all provided in the accommodation space 150. The first heat exchange device 162 performs heat exchange with the gas flowing in the accommodation space 150, so that the temperature of the flowing gas is always lower than the temperature of the reaction chamber 110, the first gas driving devices 161 drive the gas in the accommodation space 150 to flow in the loop formed by the reaction chamber 110 and the outer housing 140 to reduce the temperature of the outer wall of the reaction chamber 110 and prevent pollutants from depositing on the inner wall of the reaction chamber 110; in addition, the gas flows around the reaction chamber 110, thereby cooling the outer wall of the reaction chamber 110 in all directions, ensuring the uniformity of the temperature of the reaction chamber 110.

Optionally, the first heat exchange device 162 is heat conduction fins. Preferably, fans are integrated on the heat conduction fins. Of course, the type and arrangement of the first heat exchange device 162 and the first gas driving devices 161 are not limited to the above, and they can also be other structures with the same function, which is not limited in the present application.

Figure 3A:
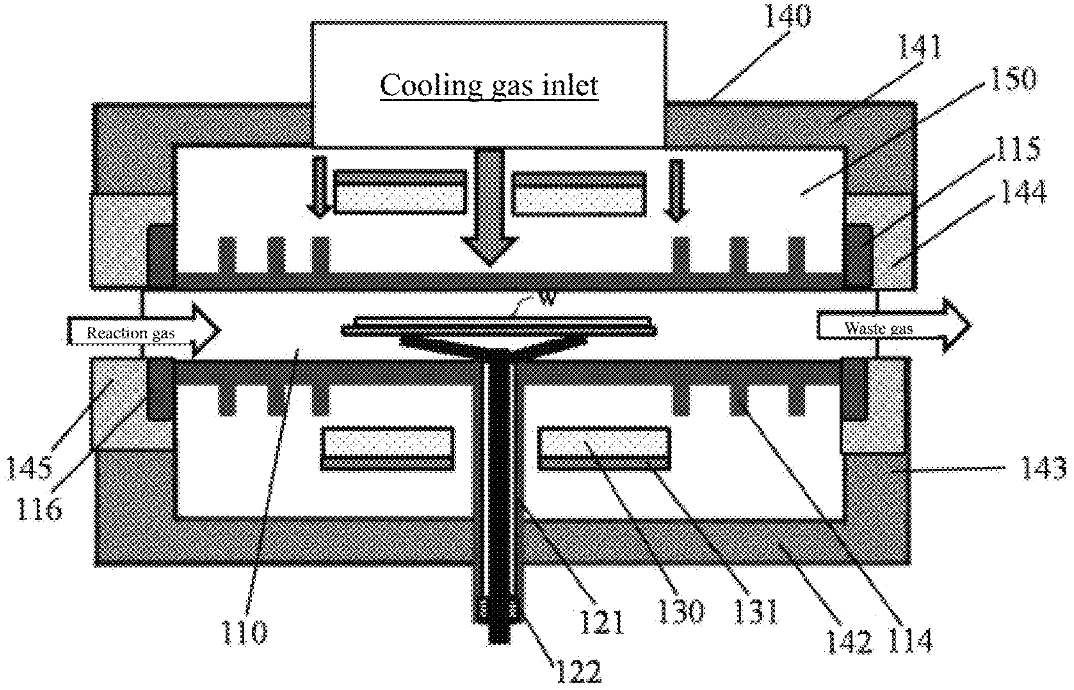
FIG. 3*a* is a schematic view of a chemical vapor deposition equipment according to embodiment 1 of the present application.

As shown in FIG. 2 and FIG. 3*a*, in the embodiment, a bottom wall of the reaction chamber 110 includes an extension tube 121 extending downwards, a rotating shaft 122 is provided in the extension tube 121, and a top of the rotating shaft 122 including a plurality of support rods for supporting and driving the susceptor 120, thereby the at least one substrate carried by the susceptor 120 rotating in the reaction chamber 110 to ensure the uniformity of the thin film deposition of the at least one substrate W. Optionally, the rotating shaft 122 can be made of quartz to reduce the risk of particle contamination. Further, the bottom of the extension tube 121 and the rotating shaft 122 are sealed with magnetic fluid to ensure the vacuum environment in the reaction chamber 110 and reduce the possibility of contamination; and in addition, the magnetic fluid may not produce resistance to the rotation of the rotating shaft 122, which further ensures the stability of the process.

In the embodiment, the radiation heat source 130 in the accommodation space 150 provides thermal energy to the reaction area of the reaction chamber 110 to ensure the thermal uniformity of the reaction area. Further, in order to ensure the utilization rate of the radiant heat energy of the radiant heat sources 130, temperature control reflectors 131 are added on a side of each of the radiant heat sources 130 away from the chamber wall of the reaction chamber 110, and the temperature control reflectors 131 reflect the thermal energy emitted by the radiant heat sources 130 in the direction of the reaction chamber 110 to maximize the transfer of heat energy generated by the radiant heat sources 130 into the reaction chamber 110. The temperature control reflectors 131 can also be provided with a cooling liquid circulation pipe, so that the temperature of the temperature control reflectors 131 may not be too high to cause deformation or to ensure the normal operation of the radiant heat sources 130 below, that is, heating lamps. Optionally, the temperature control reflectors 131 are gold reflective coatings, aluminum oxide coatings, titanium oxide coatings or other infrared reflective coatings, which are not limited in the present application.

Figure 3B:
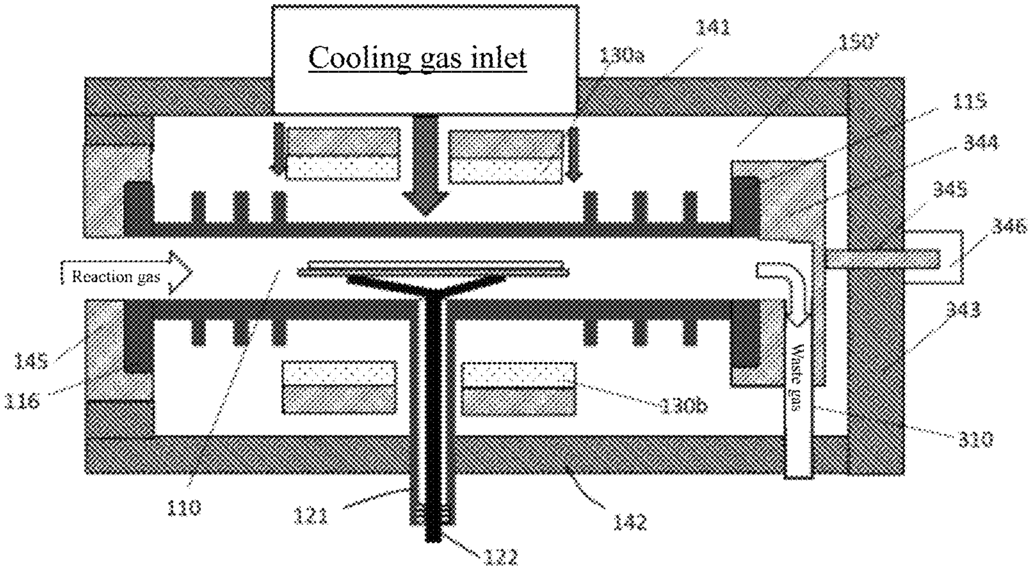
FIG. 3*b* is a schematic view of a chemical vapor deposition equipment according to another embodiment of the present application.

FIG. 3*b* is a schematic view of a chemical vapor deposition reactor according to another embodiment of the present application, compared with the embodiment shown in FIG. 3*a*, an improved design is carried out in the exhaust area of the reaction chamber and the outer housing. As shown in FIG. 3*b*, the outer housing end plate 343 is tightly connected with the top plate 141 and the bottom plate 142 of the outer housing to implement air-tightness between the accommodation space 150' and the atmospheric environment. The first fastener 344 is closely connected to the first flange 115 of the reaction chamber 110 to implement air-tightness with the external accommodation space; at least one pressure rod 345 is located between the outer housing end plate 343 and the first fastener 344, so that the first fastener 344 is tightly pressed to the first flange 115 to seal the reaction chamber 110. The pressure rod 345 passes through the outer housing end plate 343 to the atmospheric space outside the outer housing, and the pressure device 346 provides a pressing force to the pressure rod 345. The pressure device 346 may be a cylinder, one end of which is sealed with the outer wall of the outer housing end plate 343, and the driving shaft in the cylinder drives the pressure rod 345 to move horizontally. The pressure device 346 can also be an airtight bellow surrounding the pressure rod 345, one end of the latter is air tightly fixed to the outer housing end plate, and the other end can be provided with a connecting piece to be air tightly fixed to one end of the pressure rod 345. The latter and the connecting piece surround an air tight space that can move in the horizontal direction, and a driving device located in the atmospheric environment outside the outer housing, such as a cylinder or a motor, drives the connecting piece and then the pressure rod 345 to press the first fastener 344 to the first flange 115. Such a design can make the sealing structure of the reaction chamber 110 and the airtight structure of the outer housing 140 independent of each other, which is beneficial to reducing the structural design difficulty of the first fastener 344 and the outer housing 140. The chamber body of the reaction chamber 110 may undergo a temperature change of several hundred degrees during the change from room temperature to a stable process temperature, so the chamber body may undergo a large volume expansion, and as the chamber body is in the shape of a cuboid, the largest volume expansion occurs along the longitudinal direction of the cavity. The first fastener 344 of the present application can be driven by a compressible cylinder to adapt to the volume change of the expansion of the chamber body of the reaction chamber 110 while maintaining a tight compression pressure, the chamber body of the reaction chamber 110 may not deform or get broken due to excessive stress. In addition to the position and the structure of the pressure device 346 described in the described embodiments, the present application can further provide the pressure device 346 between the outer housing end plate 343 and the first fastener 344, the pressure device 346 provides pressure to the first fastener 344 through the pressure rod 345, so that the chamber body of the reaction chamber 110 is airtight. Furthermore, the pressure device 346 can be provided in the outer housing 140 to directly apply a pressing force to the first fastener 344 to implement the airtightness of the chamber body of the reaction chamber 110.

The first fastener 344 further includes a sealing cover of the reaction chamber and a waste gas exhaust pipe (310), so that the waste gas is discharged outward through the bottom plate 142 along the waste gas exhaust pipe.

Top radiant heat sources 130*a* are provided at the upper part of the cavity of the reaction chamber 110 for heating the upper surface of the at least one substrate W in the reaction chamber, bottom radiant heat sources 130*b* provided at the lower part of the cavity of the reaction chamber 110 are used for heating the susceptor 120, so that both the upper surface and the lower surface of the at least one substrate W are heated simultaneously.

Figure 4:
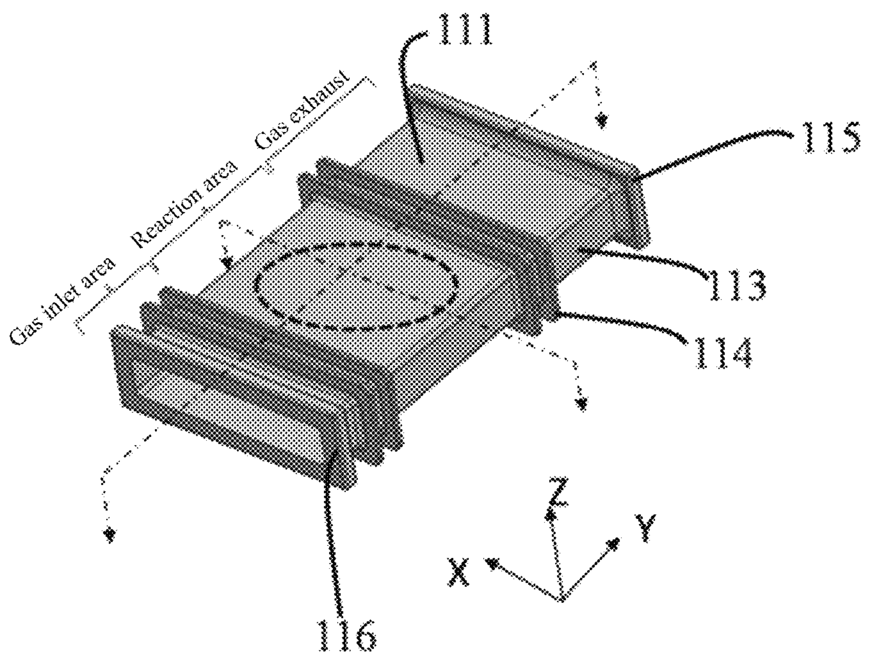
FIG. 4 is a schematic structural view of a reaction chamber in embodiment 1 of the present application.

As shown in FIG. 3*a* and FIG. 4, in order to further ensure the mechanical strength of the reaction chamber 110, the reaction chamber 110 may be provided with several reinforcing ribs 114 on the outer wall of the reaction chamber. Optionally, the density of the reinforcing ribs 114 on the outer wall of the reaction area of the reaction chamber 110 is smaller than the density of the outer wall reinforcing ribs 114 of the gas inlet area or the gas outlet area on both sides. In the embodiment, the outer wall of the reaction area of the reaction chamber 110 is not provided with the reinforcing ribs 114, only the outer walls of the gas inlet area and the gas outlet area are provided with the reinforcing ribs 114 to enhance the mechanical strength of the reaction chamber 110, thereby improving the ability to withstand pressure. The outer wall of the reaction area is not provided with the reinforcing ribs 114, which further ensures the uniformity of heat radiation from the radiant heat sources 130 to the reaction area in the reaction chamber 110, and further ensures the uniformity of the thin film deposition on the at least one substrate W. Most preferably, when the pressure in the accommodation space inside the housing is 0.5 atmospheres, the thickness of the reaction chamber wall can be slightly increased to 8-12 mm, so that the reaction area can still maintain a stable structure of the reaction chamber without reinforcing ribs. Further, when the pressure in the accommodation space is reduced to 0.3 atmospheres, a smaller wall thickness of the reaction chamber can be selected. As the pressure decreases, the heat conduction efficiency between the reaction chamber wall and the housing in the accommodation space 150 may decrease, and a heat conduction gas with higher heat conduction ability than air can be selected, such as $H_2$ or helium.

In other embodiments, the outer wall of the reaction area may provide one reinforcing rib 114, the downward projection of the reaction area reinforcing rib 114 passes through the center of the to-be-processed substrate, while no reinforcing ribs 114 or one or more reinforcing ribs 114 can be provided on the outer walls of the gas inlet area and the gas outlet area. As the present application adopts a chamber-in-chamber structure, the pressure on the quartz outer wall of the reaction cavity is greatly reduced to less than half of that of the prior art, therefore, only one reinforcing rib 114 can be provided in the reaction area, and the stability of the reaction cavity can be realized during the long-term vacuum treatment process. The design of providing one reinforcing rib 114 in the reaction area can reduce the wall thickness of the reaction cavity to a level close to that of the prior art, such as 6-8 mm, although this may slightly affect the uniformity of the temperature in the reaction cavity, however, the heating efficiency of the overall reaction cavity is improved to a certain extent, the comprehensive effect thereof can still far exceed the prior art technical solutions in which a plurality of reinforcing ribs 114 are provided in the reaction area. When one reinforcing rib 114 is provided in the reaction cavity, the reinforcing rib 114 may fuse with the extension tube 121 when extending downward to the bottom wall of the reaction cavity. The thickness and shape of the extension tube 121 are only designed to make the rotating shaft 122 surrounded by a vacuum in the cylindrical extension tube, which cannot withstand the huge pressure on the reinforcing ribs 114 caused by the atmospheric pressure of the entire reaction cavity, therefore, it is necessary to set a transition part between the rotating shaft and the reinforcing rib 114, the transition part is provided on the bottom wall of the reaction cavity and extends downwards, the thickness thereof is greater than the thickness of the bottom wall of the reaction cavity, and the area thereof is much larger than the cross-sectional area of the extension tube 121, the transition part is connected to the outer wall of the extension pipe 121, and may also be connected to two ends of the reinforcing ribs 114 on both sides. Finally, the reinforcing ribs 114 corresponds to the center of the substrates, and the extension tube 121 and the transition part jointly form a stressed annular structure, so that the quartz reaction chamber 110 can withstand the weakened pressure difference of the present application.

In the embodiment, the reinforcing rib 114 and the reaction chamber 110 are both made of quartz, and the quartz material is optically transparent materials, the reaction chamber 110 and the reinforcing rib 114 made of quartz can reduce the loss of heat energy generated by the radiant heat sources 130 during transmission and improve the efficiency of heat energy transfer. In addition, the reinforcing rib 114 and the reaction chamber 110 are made of the same material, reducing the manufacturing difficulty of the devices, further ensuring the tightness of the combination of the above two, and enhancing pressure resistance thereof.

In the embodiment, as shown in the FIG. 3*a*, the outer housing 140 provided outside the reaction chamber 110 includes a top plate 141, a bottom plate 142 and side walls 143, the outer housing 140 is provided with a first fastener 144 and a second fastener 145 inside, the top plate 141, the bottom plate 142 and the side walls 143 together with the outer wall of the reaction chamber 110, the first fastener 144 and the second fastener 145 form the accommodation space 150. In the embodiment, the outer housing 140 is made of aluminum, and the first fastener 144 and the second fastener 145 are made of stainless steel.

Further, two ends of the reaction chamber 110 include a first flange 115 and a second flange 116, and the first flange 115 and the second flange 116 are closely attached to a first fastener 144 and a second fastener 145 on the outer housing respectively, so as to fix the reaction chamber 110 into the outer housing 140. Optionally, the first flange 115, the second flange 116, the first fastener 144, and the second fastener 145 are connected by bolt components. It should be noted that the connection method between the reaction chamber 110 and the outer housing 140 is not limited to the above, and it may also be other connection methods, as long as the airtight connection between the reaction chamber 110 and the outer housing 140 is realized, which is not limited in the present application.

In order to further improve the cooling effect of the flowing gas in the accommodation space 150, in the embodiment, the outer housing 140, the first fastener 144 and the second fastener 145 are all provided with cooling fluid channels 170, so that the flowing gas performs heat exchange to improve the cooling effect on the outer wall of the reaction chamber 110. Optionally, the cooling fluid is water or cooling oil or other cooling media, which is not limited in the present application.

Figure 5:
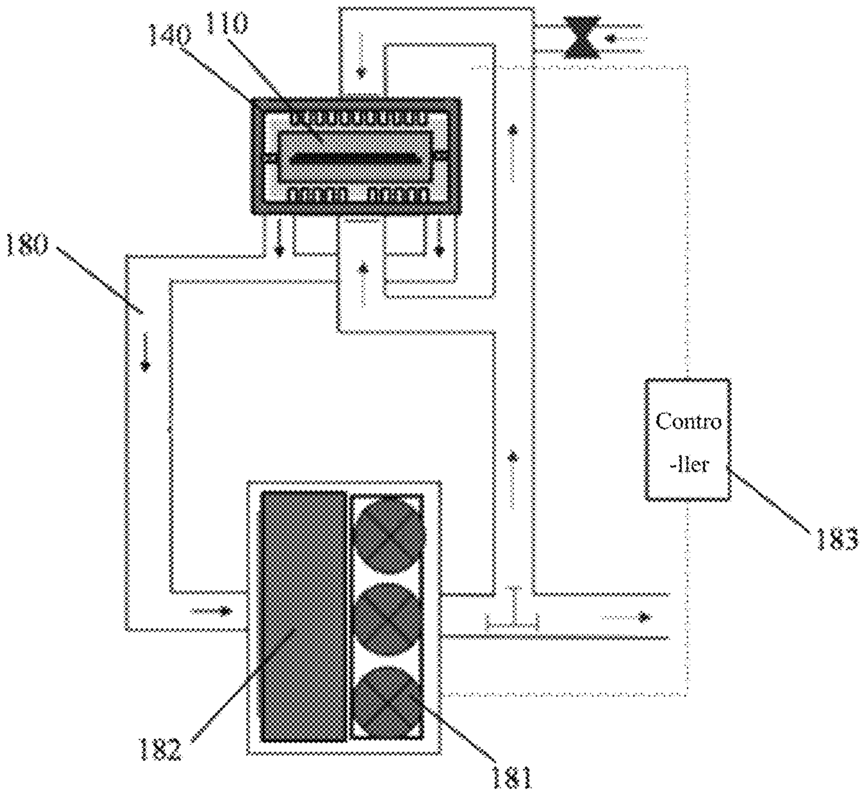
FIG. 5 is a schematic view of another chemical vapor deposition equipment according to embodiment 1 of the present application.
Figure 6:
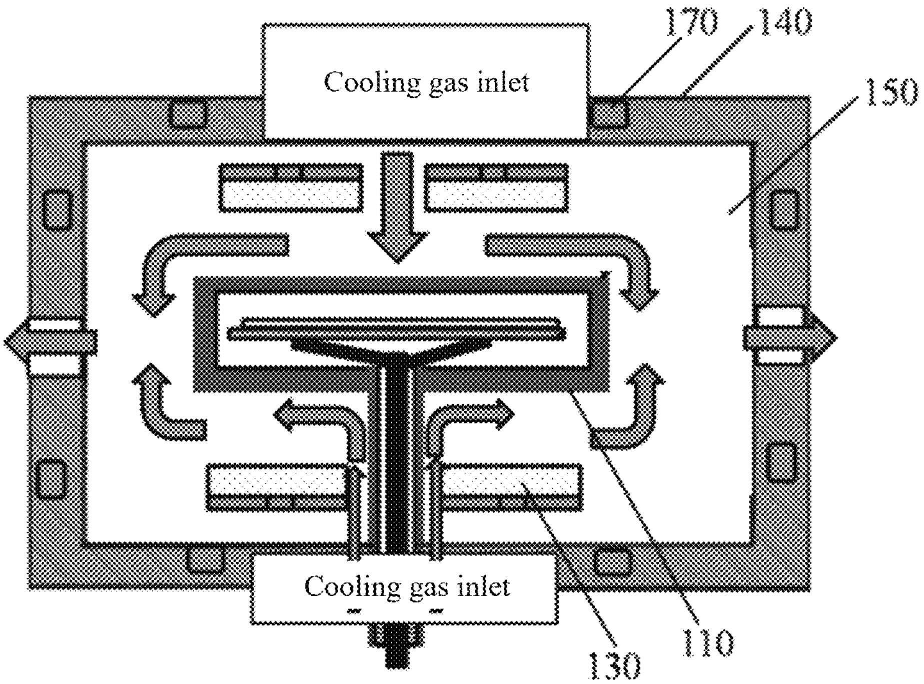
FIG. 6 is a schematic view of gas flow in another chemical vapor deposition equipment according to embodiment 1 of the present application.

Further, as shown in FIG. 5 and FIG. 6, in order to further improve the temperature control efficiency of the accommodation space 150, the chemical vapor deposition equipment of the present application also includes a temperature control loop 180, the temperature control loop 180 is a closed gas flow pipeline, which is connected to the accommodation space 150 to form a closed gas flow loop. Specifically, the temperature control loop 180 includes a second gas driving devices 181 and a second heat exchange device 182, the second gas driving devices 181 drives gas to circulate in the closed loop, and the second heat exchange device 182 is used for heat exchange and cooling of the gas, so as to keep the gas in the closed loop at a low temperature, thereby reducing the temperature of the outer wall of the reaction chamber 110 and preventing pollutants from depositing on the inner wall of the reaction chamber 110. Optionally, only one gas driving device is provided in the closed loop formed by the temperature control loop 180 and the accommodation space 150, the present application does not limit the number of gas driving devices, as long as the gas flow in the loop can be strengthened.

Optionally, the gas in the temperature control loop 180 flows into the accommodation space 150 from the top and/or bottom of the accommodation space 150, and the gas in the accommodation space 150 flows out from both sides of the accommodation space 150. In the embodiment, the gas in the temperature control loop 180 flows into the accommodation space 150 from the top and the bottom of the accommodation space 150 respectively, so that the temperature difference between the top and the bottom of the reaction chamber 110 is balanced, helping to ensure the uniformity of the temperature in the reaction chamber 110, thereby ensuring the uniformity of the thin film deposition on the at least one substrate W.

In the embodiment, the cooling gas flows out from both sides of the accommodation space 150 and passes through the second heat exchange device 182 and the second gas driving devices 181 of the temperature control loop 180 successively. In the process, the reaction chamber 110 is usually at a high temperature, and the temperature of the accommodation space 150 outside the reaction chamber 110 is also high, and the temperature of the gas flowing out of the accommodation space 150 is slightly higher than the preset cooling temperature. In the embodiment, the gas flowing out of the accommodation space 150 first passes through the second heat exchange device 182 for heat exchange and cooling, and then flows through the second gas driving devices 181 to continue the air circulation, preventing the overheated gas from directly contacting the second gas driving devices 181 to cause damage to the second gas driving devices 181, prolonging the service life of the second gas driving device 181, and reducing the maintenance cost of the device.

Optionally, the gas used for cooling is air, helium, nitrogen or a mixture of nitrogen and helium to obtain the best thermal conductivity and fluid mass flow rate. Of course, the type of the gas is not limited to the above, and it can also be other gas with a cooling effect, which is not limited in the present application.

Further, as shown in the FIG. 5, the temperature control loop 180 also includes a controller 183, the controller 183 is connected to the second gas driving devices 181, and the controller 183 is used for controlling the second gas driving device 181 to regulate the flow rate of the cooling gas, so as to implement precise control of gas cooling. Generally, the faster the cooling gas flows in the closed loop formed by the accommodation space 150 and the temperature control loop 180, the better the cooling effect and the higher the cooling efficiency.

Figure 7:
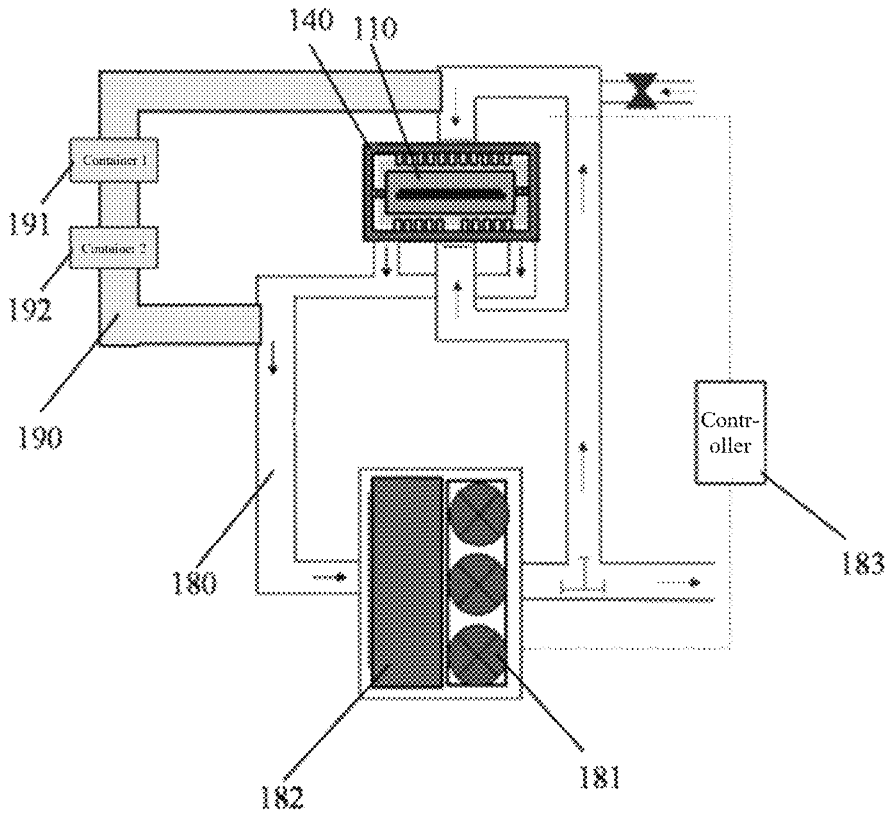
FIG. 7 is a schematic view of another chemical vapor deposition equipment according to embodiment 1 of the present application.

In practical applications, some processes require short-term rapid cooling of the reaction chamber 110 to achieve the expected effect of the process. On this basis, the chemical vapor deposition equipment of the present application further includes a secondary temperature control loop 190. The secondary temperature control loop 190 shown in FIG. 7 is connected to the temperature control loop 180 and the accommodation space 150, and valves can be provided between the loops so as to implement communication when necessary. The secondary temperature control loop 190 includes at least two containers with a pressure difference. In the embodiment, the secondary temperature control loop includes a first container 191 whose internal pressure is higher than that of the accommodation space and a second container 192 whose internal pressure is lower than that of the accommodation space.

When the reaction chamber 110 needs to be cooled rapidly, the second gas driving device 181 of the temperature control loop 180 stops working, and the first container 191 and the second container 192 of the secondary temperature control loop 190 are opened, the gas in the closed loop formed by the accommodation space 150, the temperature control loop 180 and the secondary temperature control loop 190 flows rapidly in a short time as a result of the pressure difference between the first container 191, the second container 192 and the accommodation space 150 to quickly takes the heat from the outer wall of the reaction chamber 110 away from the surrounding side of the reaction chamber 110 to rapidly reduce the temperature of the reaction chamber 110. In addition, the closed loop path formed by the three is relatively long, which provides sufficient time and path length for the heat exchange of the cooling gas, and helps to implement rapid cooling of the reaction chamber 110.

Further, the secondary temperature control loop 190 of the present application also includes a pressure control device, which is connected to each of the containers so as to adjust the pressure in the containers. As mentioned above, when the first container 191 and the second container 192 in the secondary temperature control loop 190 are opened to implement rapid cooling of the reaction chamber 110, the pressure in the first container 191 and the second container 192 may be consistent with the pressure in the accommodation space 150; in order to use it for the next rapid cooling process, a pressure control device is used for adjusting the pressure in the first container 191 and the second container 192 so that each container has a certain pressure difference from the accommodation space 150. Optionally, the pressure control device includes a vacuum pump, and of course it can also include other pressure adjusting devices.

Based on the same inventive concept, the present application also provides a deposition method using the chemical vapor deposition equipment, the method including: introducing the substrate W onto the susceptor 120 in the reaction chamber 110; the pressure adjusting device regulating a pressure of the accommodation space 150, so that the pressure in the accommodation space 150 is lower than an atmospheric pressure; performing chemical vapor deposition process in the reaction chamber 110, and the first gas driving devices 161 driving the gas flow in the accommodation space 150. The method not only reduces the pressure on the chamber wall of the reaction chamber 110, avoids destroying the uniformity of the thin film deposition process in the reaction chamber 110, but also reduces the temperature of the outer wall of the reaction chamber 110; the gas flowing in the accommodation space 150 makes the heat of the outer wall of the reaction chamber 110 leave the outer surface of the reaction chamber 110, preventing pollutants from adhering to the inner wall of the reaction chamber 110.

Optionally, pressure adjusting device(s) are used for making the pressure in the accommodation space 150 be 0.1-0.6 atmospheres, so as to reduce the pressure difference between the inside and outside of the reaction chamber 110 and weaken the pressure it bears. Of course, the pressure range in the accommodation space 150 is not limited to the above range, and can be adjusted according to actual process requirements, which is not limited in the present application. If the pressure in the accommodation space 150 is too low (<0.1 atmospheric pressure), there may be too few gas molecules in the accommodation space 150, and the first gas driving devices 161 cannot drive a large number of gas molecules to move between the outer wall of the reaction chamber 110 and the outer housing 140, resulting in a significant reduction in the heat dissipation capability of the reaction chamber 110, a large amount of deposits may inevitably be generated on the inner wall of the reaction chamber 110, which not only causes uneven temperature distribution but also causes particles to fall and cause device failure. If the pressure is too high, the effect of the present application on reducing the pressure difference inside and outside the reaction chamber is not obvious, and it is still necessary to provide a large number of ribs 114 on the outer wall of the chamber to make the chamber withstand the huge pressure difference on both sides.

Further, the method also includes: the second gas driving devices 181 of the temperature control loop 180 driving the gas to flow in the closed loop formed by the temperature control loop 180 and the accommodation space 150, and the second heat exchange device 182 performing heat exchange on the gas in the closed loop, thereby keeping the gas at a low temperature and improving its cooling effect on the reaction chamber 110.

Further, the method also includes: when the process requires short-term rapid cooling of the reaction chamber 110, the second gas driving devices 181 of the temperature control loop 180 stop working, and the first container 191 and the second container 192 of the secondary temperature control loop 190 are opened, so that the gas in the temperature control loop 180, the temperature control secondary 190 and the accommodation space 150 flows rapidly, quickly removing the heat from the outer wall of the reaction chamber 110 to reduce the temperature of the outer wall of the reaction chamber 110.

Based on above method, the method also includes: after the first container 191 and the second container 192 of the secondary temperature control loop 190 are opened, the pressure control device adjusts the internal pressure of the first container 191 and the second container 192 to maintain a certain pressure difference between the first container 191 and the second container 192 and the accommodation space 150.

Embodiment 2

Figure 8:
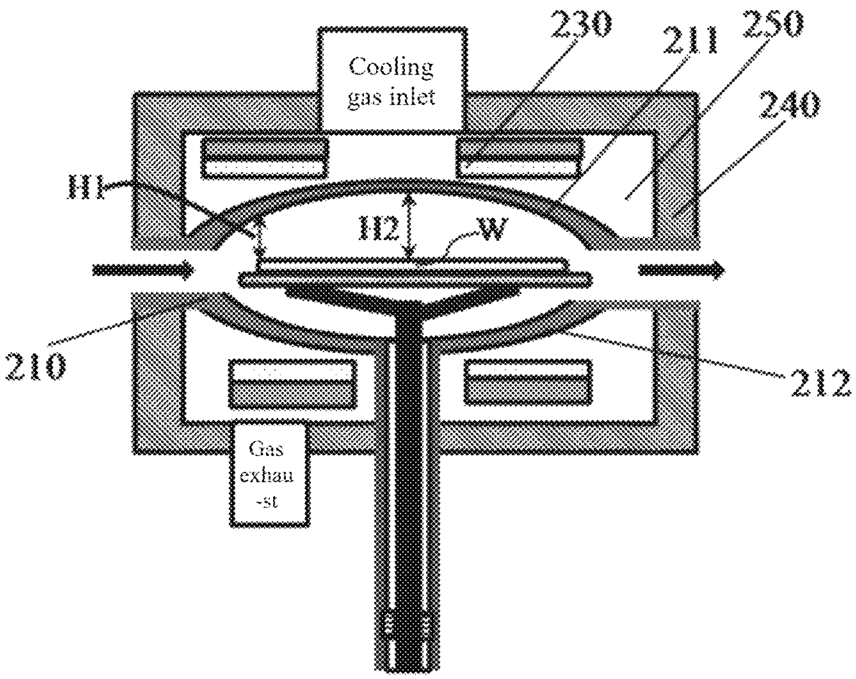
FIG. 8 is a schematic view of a chemical vapor deposition equipment according to embodiment 2 of the present application.

As shown in FIG. 8, it is a chemical vapor deposition equipment of the embodiment. The reaction chamber 210 of the chemical vapor deposition equipment includes a dome-shaped top wall 211. In the embodiment, both the top wall 211 and the bottom wall 212 of the reaction chamber 210 are dome-shaped, a height from an edge of the substrate W to the top wall 211 is H1, and a height from center of the substrate W to the top wall 211 is H2, the $H2<1.05*H1$. The outside of the reaction chamber 210 is provided with an outer housing 240, and when the deposition process is performed, the pressure of the accommodation space 250 between the two is adjusted to be less than atmospheric pressure by using pressure adjusting device(s), and a plurality of radiant heat sources 230 are provided in the accommodation space 250 to provide heat energy.

In the embodiment, on the basis that the pressure in the accommodation space 250 is lower than the atmospheric pressure, the top wall 211 and the bottom wall 212 of the reaction chamber 210 are dome structures with smaller arcs, which are more resistant to the pressure difference inside and outside the reaction chamber 210, and the reaction chamber 210 does not need to add reinforcing ribs on the chamber wall of the reaction chamber 210 to achieve greater pressure resistance. In addition, the curvature of the dome of the reaction chamber 210 is very small, which avoids the problem of disordered gas flow distribution in common dome structures, and the reaction gas can still maintain a horizontal flow state in the reaction area of the reaction chamber 210. The chamber-in-chamber structure of this embodiment reduces the pressure difference that the dome-shaped reaction chamber 210 needs to bear, the height of the dome is reduced, and the gas flow in the reaction chamber 210 may not have a large-scale vertical diffusion gas flow, and the structure improves the uniformity of gas flow distribution in the reaction chamber 210, contributing to the uniformity of film deposition on the substrate W, and ensuring the yield rate of substrate W production.

Similar to the embodiment 1, in the embodiment, the chemical vapor deposition equipment further includes components such as a gas driving device, a temperature control loop, and a secondary temperature control loop. Optionally, the gas in the temperature control loop is injected from the top of the accommodation space 250 between the outer housing 240 and the reaction chamber 210, and flows out from the bottom of the accommodation space 250. Further, other structures of the embodiment and the connection and function modes of each of the components may be similar to those of Embodiment 1, and may not be repeated and limited here.

To sum up, the present application provides a chemical vapor deposition equipment and a method therefor, in which the equipment combines the reaction chamber 110, the outer housing 140 and the pressure adjusting device, etc., during the process, the pressure in the accommodation space 150 between the reaction chamber 110 and the outer housing 140 is lower than the atmospheric pressure through the pressure adjusting device, which not only reduces the pressure difference between the inside and outside of the reaction chamber 110, but also relieves the pressure resistance of the reaction chamber 110, further ensures the uniformity of gas flow and heating in the reaction chamber 110, which contributes to the uniformity of film deposition on the substrate W and improves the yield rate of the substrate W process.

Further, the equipment further includes first gas driving devices 161 to strengthen the gas flow in the accommodation space 150, the gas flow takes away the heat of the outer wall of the reaction chamber 110, reduces the temperature of the outer wall of the reaction chamber 110 within a certain range, and implements the uniform cooling of the outer wall of the reaction chamber 110, prevents the deposition of pollutants on the reaction chamber 110, and ensures the cleanliness of the vacuum environment.

Further, the equipment further includes a temperature control loop 180, which forms a closed loop with the accommodation space 150, and realizes the flow and the heat exchange of cooling gas in the closed loop through the second gas driving devices 181 and the second heat exchange device 182, improving the cooling efficiency of the reaction chamber 110.

Further, the equipment further includes a secondary temperature control loop 190, which includes a first container 191 and a second container 192 with a pressure difference from the containing space 150, which can realize short-term rapid cooling of the reaction chamber 110 to achieve the desired cooling effect, further implement the adjustment and control of the process, and ensure the effect of the thin film deposition on the substrate W.

Further, the reaction chamber 110 in the equipment can be a dome-shaped structure, the height from the edge of the substrate W to the top wall is H1, the height from the center of the substrate W to the top wall is H2, and H2<1.05*H1, and the dome-shaped reaction chamber 110 has a stronger pressure resistance capability, and can achieve greater pressure resistance capability without adding additional structures such as reinforcing ribs 114, without affecting the heat transfer efficiency of the radiant heat source 130. In addition, the curvature of the dome structure of the reaction chamber 110 is small, and the gas flow in the reaction chamber 110 does not have a large-scale vertical diffused gas flow, the structure improves the uniformity of the gas flow distribution in the reaction chamber 110, contributes to the uniformity of the thin film deposition of the substrate W, and ensures the yield rate of the substrate W production.

In some embodiments, the chemical vapor deposition equipment is a processing equipment for epitaxial growth, which is used for homoepitaxial processes, such as silicon epitaxy. In the processing equipment for epitaxial growth, the gas flow needs to flow uniformly along the direction parallel to the susceptor 120, so the gas inlet and the gas exhaust are located at both ends of the reaction chamber 110, so that a long and narrow gas channel is formed in the reaction chamber 110.

In addition to being used in the above chemical vapor deposition reactor or processing equipment for epitaxial growth, the present application can also be used in other vacuum reactors, such as rapid thermal processor (RTP), the substrate is directly placed into the rapid thermal processor with processing a gas, and the heating lamp assembly set above and beneath the processor is used to quickly heat the substrate, so that the surface of the substrate is processed, but the processing gas may not react on the substrate to form a new film. As the interior of the rapid heat treatment reactor also needs a vacuum state, and the lamp group and the inner space of the reactor are also separated by a transparent reaction cavity wall, so the present application can also be applied to this present application to reduce the thickness of the reaction chamber wall. Therefore, the present application can be applied to any vacuum reaction chamber that requires lamp group heating.

Although the content of the present application is described in detail with the above preferred embodiments, it should be understood that the above description should not be considered as limiting the present application. Various modifications and alterations to the present application may become apparent to those skilled in the art upon reading the above application. Therefore, the scope of protection of the present application should be defined by the appended claims.

What is claimed is:

1. A chemical vapor deposition equipment, comprising:

a reaction chamber, having a gas inlet and a gas outlet, a susceptor being provided in the reaction chamber for carrying a substrate, the reaction chamber comprising a top wall in a dome-shape, a height from an edge of the substrate to the top wall being H1, and a height from a center of the substrate to the top wall being H2, H2<1.05* H1;

an outer housing, provided outside the reaction chamber, an accommodation space being formed between an inner wall of the outer housing and an outer wall of the reaction chamber, the outer housing enclosing the reaction chamber to shield the top wall in the dome- shape from atmospheric pressure;

a plurality of radiant heat sources, provided in the accommodation space and used for heating the substrate through the outer wall of the reaction chamber; and one or more pressure adjusting devices(s), used for independently regulating a pressure in the reaction chamber and the accommodation space.

2. The chemical vapor deposition equipment according to claim 1, further comprising gas driving devices, which serve to enhance a gas flow in the accommodation space.

3. The chemical vapor deposition equipment according to claim 2, wherein the gas driving devices are provided in the accommodation space to drive gas to flow around the outer wall of the reaction chamber and the inner wall of the outer housing in the accommodation space, and the outer housing is further provided with a first heat exchange device.

4. The chemical vapor deposition equipment according to claim 2, further comprising a temperature control loop, which is connected to the accommodation space and forms a closed loop together, the closed loop comprises the gas driving devices and a second heat exchange device, the gas driving devices drive gas to flow in the closed loop, and the second heat exchange device is used for cooling the gas in the closed loop.

5. The chemical vapor deposition equipment according to claim 4, wherein the gas in the temperature control loop flows into the accommodation space from a top and/or a bottom of the accommodation space, and the gas in the accommodation space flows out of the accommodation space from both sides of the accommodation space.

6. The chemical vapor deposition equipment according to claim 4, wherein the gas is air, helium, nitrogen or a mixture of nitrogen and helium.

7. The chemical vapor deposition equipment according to claim 4, further comprising a secondary temperature control loop, which is connected to the temperature control loop, the secondary temperature control loop comprises a first container in which an internal pressure is higher than that in the accommodation space, and a second container in which the internal pressure is lower than that in the accommodation space.

8. The chemical vapor deposition equipment according to claim 1, wherein the reaction chamber comprises a gas inlet area corresponding to the gas inlet, a gas outlet area corresponding to the gas outlet and a reaction area between the gas inlet area and the gas outlet area; and a plurality of reinforcing ribs are further provided on the outer wall of the reaction chamber, and a density of the plurality of reinforcing ribs on an outer wall of the reaction area is smaller than that on an outer wall of the gas inlet area or an outer wall of the gas outlet area on both sides of the reaction area.

9. The chemical vapor deposition equipment according to claim 8, wherein the plurality of reinforcing ribs and the reaction chamber are made of quartz.

10. The chemical vapor deposition equipment according to claim 1, wherein the reaction chamber comprises a gas inlet area corresponding to the gas inlet, a gas outlet area corresponding to the gas outlet and a reaction area between the gas inlet area and the gas outlet area;

wherein an outer wall of the reaction area is provided with a reaction area reinforcing rib, a downward projection of the reaction area reinforcing rib passes through a center of the substrate, a plurality of reinforcing ribs adjacent to the reaction area reinforcing rib are located on the outer wall of the reaction chamber corresponding to the gas inlet area or the gas outlet area.

11. The chemical vapor deposition equipment according to claim 10, wherein the plurality of reinforcing ribs and the reaction chamber are made of quartz.

12. The chemical vapor deposition equipment according to claim 1, wherein a bottom of the reaction chamber comprises an extension tube extending downwards, a rotating shaft is provided in the extension tube, and a top of the rotating shaft is used for supporting and driving the susceptor, thereby the substrate rotating in the reaction chamber.

13. The chemical vapor deposition equipment according to claim 1, wherein two ends of the reaction chamber comprise a first flange and a second flange, and the first flange and the second flange are closely attached to a first fastener and a second fastener on the outer housing, respectively.

14. The chemical vapor deposition equipment according to claim 13, wherein the outer housing comprises a top plate, a bottom plate and side walls, and the top plate, the bottom plate and the side walls together with the outer wall of the reaction chamber, the first fastener and the second fastener form the accommodation space.

15. The chemical vapor deposition equipment according to claim 13, wherein the outer housing is made of aluminum, and the first fastener and the second fastener are made of stainless steel.

16. The chemical vapor deposition equipment according to claim 13, wherein cooling fluid channels are provided in the outer housing, the first fastener and the second fastener.

17. The chemical vapor deposition equipment according to claim 13, wherein an outlet end of the outer housing comprises an outer housing end plate, a gap is formed between the outer housing end plate and the first fastener, and at least one pressure device is provided inside the gap or outside the outer housing for providing compressive force to the first fastener.

18. A deposition method using the chemical vapor deposition equipment according to claim 2, comprising:

transporting the substrate on the susceptor in the reaction chamber;

regulating the pressure in the accommodation space using the one or more pressure adjusting device, so that the pressure in the accommodation space is lower than an atmospheric pressure;

performing chemical vapor deposition process in the reaction chamber; and driving the gas flow in the accommodation space using the gas driving devices.

19. The deposition method according to claim 18, wherein the pressure in the accommodation space is set at 0.1-0.6 atmosphere pressure by using the one or more pressure adjusting devices.

20. A processing equipment for epitaxial growth, comprising:

a reaction chamber with a gas inlet and a gas outlet provided at both ends, wherein a susceptor is provided therein for carrying substrate, the gas inlet and the gas outlet are used for forming a reaction gas flow parallel to the susceptor; the reaction chamber comprises a gas inlet area corresponding to the gas inlet, a gas outlet area corresponding to a gas exhaust, and a reaction area between the gas inlet area and the gas outlet area, the reaction chamber comprising a top wall in a dome-shape, a height from an edge of the substrate to the top wall being H1, and a height from a center of the substrate to the top wall being H2, $H2<1.05*H1$;

an outer housing, provided outside the reaction chamber, wherein an accommodation space is formed between an inner wall of the outer housing and an outer wall of the reaction chamber, and the accommodation space is connected to a first pressure adjusting device, the outer housing enclosing the reaction chamber to shield the top wall in the dome-shape from atmospheric pressure; and a plurality of radiant heat sources, provided in the accommodation space and outside the reaction chamber for heating the substrate.

21. The processing equipment according to claim 20, wherein the reaction chamber further comprises a plurality of reinforcing ribs provided on the outer wall of the reaction chamber, wherein a density of the plurality of reinforcing ribs on an outer wall of the reaction area is smaller than that on an outer wall of the gas inlet area or an outer wall of gas outlet area on both sides.

22. The processing equipment according to claim 20, wherein a bottom of the reaction chamber comprises an extension tube extending downwards, a rotating shaft is provided in the extension tube, and a top of the rotating shaft is used for supporting and driving the susceptor, thereby the susceptor rotating in the reaction chamber.

23. The processing equipment according to claim 20, further comprising a temperature control loop connected to the accommodation space and forms a closed loop together, wherein the closed loop comprises gas driving devices and a heat exchange device, the gas driving devices drive gas to flow in the closed loop, and the heat exchange device is used for cooling the gas in the closed loop.

24. The processing equipment according to claim 20, further comprising a second pressure adjusting device connected to the reaction chamber, wherein the first pressure adjusting device and the second pressure adjusting device are independently controlled, and a pressure in the accommodation space is lower than an atmospheric pressure and higher than a pressure in the reaction chamber when the epitaxial growth is performed.

25. The processing equipment according to claim 20, further comprising gas driving devices, which serve to enhance a gas flow in the accommodation space.

26. A vacuum processing equipment, comprising:

a vacuum processing chamber, having a gas inlet and a gas outlet, and a susceptor being provided in the vacuum processing chamber for carrying a substrate, the vacuum processing chamber comprising a top wall in a dome-shape, a height from an edge of the substrate to the top wall being H1, and a height from a center of the substrate to the top wall being H2, H2<1.05* H1;

an outer housing, provided outside the vacuum processing chamber, an accommodation space being formed between an inner wall of the outer housing and an outer wall of the vacuum processing chamber, the outer housing enclosing the vacuum processing chamber to shield the top wall in the dome-shape from atmospheric pressure;

a plurality of radiant heat sources, provided in the accommodation space and used for heating the substrate through the outer wall of the vacuum processing chamber; and one or more pressure adjusting devices, used for independently regulating an pressure in the vacuum processing chamber and the accommodation space, wherein two ends of the vacuum processing chamber comprise a first flange and a second flange, and the first flange and the second flange are closely attached to a first fastener and a second fastener on the outer housing, respectively; and an outlet end of the outer housing comprises an outer housing end plate, a gap is formed between the outer housing end plate and the second fastener, and at least one pressure device is provided inside the gap or outside the outer housing for providing compressive force to the second fastener.

* * * * *